United States Patent [19]

Gehle

[11] 4,237,086

[45] Dec. 2, 1980

[54] METHOD FOR RELEASABLY MOUNTING A SUBSTRATE ON A BASE PROVIDING HEAT TRANSFER AND ELECTRICAL CONDUCTION

[75] Inventor: Richard W. Gehle, Yorba Linda, Calif.

[73] Assignee: Rockwell International Corporation, El Segundo, Calif.

[21] Appl. No.: 13,952

[22] Filed: Feb. 22, 1979

Related U.S. Application Data

[63] Continuation of Ser. No. 821,034, Aug. 1, 1977, abandoned.

[51] Int. Cl.$^3$ ............................................. B29H 21/04
[52] U.S. Cl. .............................. 264/130; 174/16 HS; 264/272; 264/338; 357/75; 357/81
[58] Field of Search .................... 264/130, 272, 338; 174/16 HS; 357/75, 81

[56] References Cited

U.S. PATENT DOCUMENTS

| | | | |
|---|---|---|---|
| 3,182,115 | 5/1965 | Moran et al. | 174/16 HS |
| 3,391,242 | 7/1968 | Sudges | 357/81 X |
| 3,805,123 | 4/1974 | Rieger | 317/234 A X |
| 3,955,169 | 5/1976 | Kerfoot et al. | 174/16 HS X |
| 3,982,271 | 9/1976 | Olivieri et al. | 357/81 |
| 3,996,447 | 12/1976 | Bouffard et al. | 174/16 HS X |
| 4,034,469 | 7/1977 | Koopman et al. | 357/81 X |

*Primary Examiner*—Philip Anderson
*Attorney, Agent, or Firm*—H. Fredrick Hamann; Gilbert H. Friedman

[57] ABSTRACT

The bottom surface of a substrate and the support surface of a base on which the substrate is to be mounted are treated with a release agent. A thin layer of a conformable resin is interposed between the treated surfaces of the substrate and base. Pressure is applied to cause the layer of resin to conform to irregularities in the two surfaces. This forms a heat transfer path between the substrate and base. It is particularly effective for heat transfer in a vacuum. Pressure on the conforming resin is maintained by rigid, releasable mechanical fasteners which hold the substrate to the base. Where good electrical conduction between the substrate and base is required in addition to good heat transfer, the resin is one of the electrically conductive types such as those filled with a powdered metal. Nondestructive removal of the substrate is accomplished by releasing the mechanical fasteners.

9 Claims, 1 Drawing Figure

U.S. Patent     Dec. 2, 1980     4,237,086
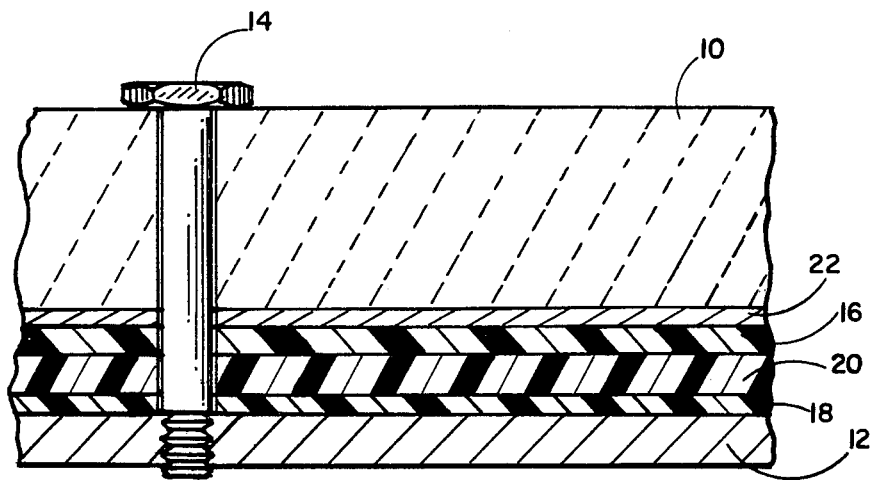

METHOD FOR RELEASABLY MOUNTING A SUBSTRATE ON A BASE PROVIDING HEAT TRANSFER AND ELECTRICAL CONDUCTION

The invention herein described was made in the course of or under a contract or subcontract thereunder with the Air Force.

This is a continuation of application Ser. No. 821,034 filed Aug. 1, 1977 now abandoned.

BACKGROUND OF THE INVENTION

1. Field of the Invention

The present invention relates generally to methods of providing a releasable attachment between a substrate and a base and, more particularly, pertains to a releasable attachment which provides a heat transfer path and, optionally, an electrical conduction path between the substrate and the base.

2. Description of the Prior Art

Microelectronic subsystems and some microelectronic modules are too expensive to be thrown away if only a small part of the circuitry therein fails. Accordingly, it is desirable to be able to remove a defective module from a larger network in which it is interconnected without causing additional damage to the subsystem. Relatively rigid mechanical fasteners such as screws and spring-loaded clamps, for example, have been used to provide an easily releaseable attachment between a substrate on which microelectronic circuitry is disposed and a base or chassis which provides support for the substrate.

However, an attachment between a substrate and a base usually is relied upon to provide more than mechanical support. Heat transfer from the circuitry on the substrate to the base is almost always an important consideration. The mechanical fasteners mentioned are frequently formed of a thermally insulating material such as nylon. These contribute little to heat transfer. The interface between the botton surface of the substrate and the opposing surface of the base is relied upon to conduct away from the substrate that portion of the heat which is not dissipated by convection.

Where convection is not an available contributor to heat dissipation, as in the case where the microelectronic subassembly is to be operated in a vacuum or in space, the quality of the interface between the substrate and the base becomes an especially important consideration. Where pressure alone holds the substrate to the base, the interface is a relatively poor one for heat transfer. The surfaces are ordinarily quite irregular when viewed microscopically. Therefore, actual contact occurs between the two surfaces over a relatively small percentage of the contact area.

The bottom or attachment side of the substrates requiring mounting is sometimes metallized as, for example, in the case of microwave integrated circuits. The bottom metallization serves as a ground plane for stripline waveguides wherein the rf energy is propagated through a dielectric substrate. Satisfactory performance of such microwave integrated circuitry requires very low electrical resistance in the interconnections between the ground planes on the many substrates in a system. The interconnection paths include the bases which may be, for example, aluminum chassis. Relatively high resistance interconnections introduce parasitic impedances into the circuitry. Low resistance, relatively permanent attachments between a substrate and a base have long been made through the use of solder and adhesives such as the epoxy resins which are mixed or filled with metallic powders. Such attachments also serve to conform the surfaces of the substrate and base and, thus, enhance heat transfer also. However, these prior art attachment techniques have the drawback that they are difficult and expensive to release when it is desired to detach a particular module.

3. Prior Art Statement

The following publications are regarded as having pertinence to this invention.

(a) Crane, U.S. Pat. No. 4,012,832, "Method for Nondestructive Removal of Semiconductor Devices," issued Mar. 22, 1977.

(b) MIL-STD-1334B, "Military Standard, Process for Barrier Coating of Anti-Friction Bearings," 4 January 1977.

The patent to Crane discloses a method for releasably attaching semiconductor devices to a substrate and releasably attaching substrates to a base wherein the attachment comprises two layers of conductive adhesive plastic separated by a small chip of conductive alloy which melts above the curing temperature of the adhesive plastic. Release is accomplished by melting the conductive alloy.

The Military Standard discloses that the release agent discussed hereinafter and described as the preferred release agent for practicing this invention is known to have been used for the protection of electrical contacts against lubricant contamination. It is believed that the contacts referred to in this publication are the type used for the movable and stationary contacts of electromagnetic relay devices.

SUMMARY OF THE INVENTION

The present invention is a method of providing an easily releasable attachment for mounting substrates on bases wherein the attachment has good heat transfer and, if required, good electrical conduction properties. Mechanical fasteners such as screws or clamps are used to give the attachment rigidity. Releasing the mechanical fasteners allows non-destructive removal of the substrate from the base without a need for heating or for applying forces to sever a heat transfer or electrical conduction member.

A heat transfer member is provided between the bottom surface of the substrate and the corresponding attachment surface of the base. This heat transfer member is, at least initially, a layer of a conformable fluid such as an uncured or only partially cured epoxy resin which is then conformed, under pressure, to the irregularities in the two surfaces. Either one or both of the two surfaces are treated with a release agent which prevents the conformable material from adhering to the treated surface. Where electrical conduction through the heat transfer member is required, the conforming material is a filled type which is made conductive by the addition thereto, for example, of a powdered metal. In addition, the treatment of a surface with a release agent is controlled to deposit a film which is sufficiently thin to be electrically conductive.

BRIEF DESCRIPTION OF THE DRAWINGS

The sole FIGURE is a schematic cross-sectional view showing a substrate attached to a base in a manner consistent with this invention.

DESCRIPTION OF THE PREFERRED EMBODIMENT

In order to mount a substrate on a base according to this invention, the related surfaces of the substrate and base are first treated to have a low surface energy. The bottom surface of a substrate is related to that portion of the surface of a base on which the substrate is to be mounted. A suitable base is, for example, an aluminum box chassis. The related surfaces require treatment in order to be non-adherent to conforming material to be interposed between the surfaces as described below.

The treatment to lower the surface energy of the related substrate and base surfaces comprises coating those surfaces with a thin film of a release agent. Release agents which are suitable for this purpose are of the type which are used to coat the molds on which such glass fiber structures as boat hulls or the like are formed. These release agents are commercially available from various suppliers.

The release agent coating is preferably a thin film of the fluoropolymer 1H, 1H-pentadecafluorooctylmethacrylate. This material has excellent anti-wetting and anti-sticking properties due to its low surface energy. It is readily dissolved in one of the volatile fluorinated carrier solvents known generically as fluorocarbons such as the one sold under the trademark Freon TF by E. I. du Pont de Nemours & Co. A dilute solution of the fluoropolymer is applied to the cleaned and moisture-free related surfaces of the base and substrate. The solution may be applied by brushing, spraying, or flooding although it is preferably applied by dipping. Deposition of the thin film of the fluoropolymer is by the relatively rapid evaporation in air of the solvent.

The thickness of the film of fluoropolymer deposited is required to be controlled. If the film is too thin, other materials will adhere to it too readily. It has been determined that deposition of the fluoropolymer from solutions which are no more dilute than 0.1% by weight will produce films which are about 0.002 mils (500 angstroms) thick which is a sufficient thickness. On the other hand, if the film is too thick, it will function as an electrical insulator. This cannot be permitted in the case where the attachment is required to provide good electrical conduction, as well as heat conduction, from the substrate to the base. It has been determined that films deposited from two coats of a solution of about 0.2% by weight of the fluoropolymer are about 0.004 mils (1000 angstroms) thick. That thickness has been found to provide both satisfactory anti-sticking properties and good electrical conduction. The electrical resistance of such films is less than 1 milliohm per square inch when measured with an ordinary laboratory digital ohmmeter.

A 0.18% by weight solution of the preferred fluoropolymer release agent is made and sold as Fluorad Brand Surface Modifier, FC-723, by the Commercial Chemicals Division of the 3M Company, Saint Paul, Minnesota 55101.

When the related surfaces of the substrate and base have been treated to be non-adherent, a layer of a conforming material is interposed between those surfaces. The substrate and base are then forced toward each other with moderate pressure. This pressure assists the conforming material in its flow into the voids and irregularities between the two surfaces. The two surfaces are thus mated to each other for good heat transfer.

The conforming material may be any material which is suitably stable once it sets but is sufficiently fluid under moderate pressure before it sets to flow into and fill the surface voids and irregularities. The epoxy resins which are fluid at room temperature until they are set or cured by a suitable catalyst are good conforming materials. However, in the fluid state, the epoxy resins are a solvent for the fluoropolymer release agent. Partially cured sheets of "B-stage" epoxy are therefore preferred for this application. These are available in flexible sheets of plastic about five mils thick. The "B-stage epoxy" becomes fluid for a time while it is curing but does not have any significant adverse effect on the film of release agent. A preferred form of "B-stage" epoxy with good electrical conduction through the heat transfer member is silver-filled Ablefilm ECF-518 made by the Ablestik Laboratories in Gardena, Calif.

The substrate is rigidly fixed to the base using a standard screw or spring-loaded clamp. This mechanical fastener also serves to maintain pressure on the heat transfer member between the substrate and base so that the heat transfer and, when required, electrical conduction path is not broken. The fastener may be installed as part of the procedure and means for applying pressure to the epoxy resin while it is fluid or it may be installed after the conforming material has cured to hardness.

The FIGURE is a cutaway sketch depicting a substrate 10 attached to a base 12 in the manner described above. It is to be understood that the dimensions shown in the FIGURE are not to scale but are chosen to enhance the illustration and explanation herein. Thin films of a fluoropolymer release agent 16 and 18 are shown coating the related surfaces of the substrate 10 and base 12, respectively. A layer 20 of epoxy resin conformed to the related surfaces and cured is shown interposed between those surfaces. The particular embodiment shown in the FIGURE is one in which the substrate 10 has a layer 22 of metal deposited on the bottom surface thereof to serve as a ground plane for microwave integrated circuits on the substrate. A screw 14 is an easily releasable mechanical fastener holding the substrate 10 rigidly to the base 12 while maintaining pressure on the films 16, 18, and 20.

Inasmuch as the FIGURE shows a substrate 10 having a ground plane 22 thereon, it will be understood that the thickness of the fluoropolymer films 16 and 18 is controlled so that those films are insignificantly electrically resistive. In addition, the layer of conforming material 20 is made conductive by metallic filling therein.

Tests conducted on 50 ohm stripline microwave waveguides (not shown) fabricated on an alumina substrate 10 and attached to an aluminum box chassis 12 showed satisfactory performance, i.e., lossiness which is not excessive, in the frequency range from 100 MHz to 2 GHz.

There has been described a preferred embodiment of the invention. However, it will be apparent to those skilled in the art that there are other embodiments which fall within the spirit and scope of this invention. For example, although in the preferred embodiment both of the related surfaces of the substrate and base are treated with release agent so that the conforming material will not adhere well to either of them, this is not a necessary approach to the practice of this invention.

The mounting of a substrate on a base will be as easily releasable if only one of the two related surfaces is treated with the surface modifying release agent. Thus, it may be equally satisfactory to treat only the related surface of the base. In this case, where a microelectronic module is to be subsequently released and removed from a subassembly, the layer of conforming material adheres strongly to the bottom surface of the substrate. Where the module is to be discarded rather than reworked, this may present no disadvantage.

Yet again, it is within the scope of the invention to treat only the related surface of the substrate. In this case, the layer of conforming material will remain adhering to the base when a substrate is removed.

Having thus described preferred embodiments of the invention, what is claimed is:

1. A method of mounting a substrate for microelectronic circuitry on a base wherein a releasable attachment is formed between an attachment surface of said substrate and a related attachment surface of said base, wherein said attachment surfaces of said substrate and of said base are of electrically conductive material, said method comprising:
    treating at least one of said attachment surfaces with a surface modifier to form a film of a fluoropolymer release agent maintained on said at least one of said attachment surfaces wherein said film is thick enough to have anti-sticking properties but no thicker than about 1000 angstroms;
    disposing a layer of an adhesive, catalytically polymerizable, and conformable material filled with an electrically conductive material between said substrate and base attachment surfaces; and
    applying opposing forces to said substrate and said base in a manner which applies pressure to said conformable material and causes said conformable material to flow into and fill voids and irregularities in said attachment surfaces, thereby mating said attachment surfaces to each other for relatively high thermal conductivity and relatively low electrical resistance between said surfaces.

2. The method recited in claim 1 wherein said step of treating comprises:
    applying a dilute solution of said release agent to said at least one of said attachment surfaces;
    evaporating said dilute solution to deposit said film of said release agent on said at least one of said attachment surfaces; and
    controlling the concentration of said release agent in said solution to assure that said film is thick enough to have anit-sticking properties but no thicker than about 1000 angstroms.

3. The method recited in claim 2 wherein said fluoropolymer is 1H,1H-pentadecafluorooctylmethacrylate.

4. The method recited in claim 3 wherein said surface modifier is a solution of no less than about 0.1 percent by weight of said fluoropolymer in a volatile fluorinated carrier solvent.

5. The method recited in claim 4 wherein said fluoropolymer film has a thickness of at least about 500 angstroms.

6. The method recited in claim 1 wherein said conformable material is an epoxy resin.

7. A method of mounting a substrate for microelectronic circuitry on a base wherein a releasable attachment is formed between an attachment surface of said substrate and a related attachment surface of said base, wherein said attachment surfaces of said substrate and of said base are of electrically conductive material, said method comprising the steps of:
    providing a dilute solution of a fluoropolymer release agent dissolved in a volatile fluorinated carrier solvent;
    preselecting a number of times for treating at least one of said attachment surfaces with said dilute solution;
    controlling the concentration of said fluoropolymer release agent in said solution to insure that treatment of said at least one of said attachment surfaces with said solution for said preselected number of times will form a film of said release agent thereon which is thick enough to have anti-sticking properties and thin enough to have low electrical resistance;
    treating said at least one of said attachment surfaces with said dilute solution for said preselected number of times to form said film of said release agent thereon whereby said film is found to be at least about 500 angstroms thick but no thicker than about 1000 angstroms;
    disposing a layer of an adhesive, catalytically polymerizable, and conformable material filled with an electrically conductive material between said substrate and base attachment surfaces; and
    applying opposing forces to said substrate and said base in a manner which applies pressure to said conformable material and causes said conformable material to flow into and fill voids and irregularities in said attachment surfaces, thereby mating said attachment surfaces to each other for relatively high thermal conductivity and relatively low electrical resistance between said surfaces.

8. The method recited in claim 7 wherein the concentration of said fluoropolymer release agent in said solution is controlled to be in the range from about 0.1 percent by weight to about 0.18 percent by weight.

9. The method recited in claim 8 wherein said number of times for treating is selected to be once.

* * * * *